United States Patent
Zollner et al.

(10) Patent No.: US 7,416,605 B2
(45) Date of Patent: Aug. 26, 2008

(54) ANNEAL OF EPITAXIAL LAYER IN A SEMICONDUCTOR DEVICE

(75) Inventors: Stefan Zollner, Austin, TX (US); Veeraraghavan Dhandapani, Round Rock, TX (US); Paul A. Grudowski, Austin, TX (US); Gregory S. Spencer, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/620,987

(22) Filed: Jan. 8, 2007

(65) Prior Publication Data

US 2008/0163813 A1 Jul. 10, 2008

(51) Int. Cl.
*C30B 25/14* (2006.01)
*C30B 25/12* (2006.01)

(52) U.S. Cl. .................. 117/89; 117/4; 117/93; 117/102

(58) Field of Classification Search .............. 117/4, 117/89, 93, 102
See application file for complete search history.

(56) References Cited

U.S. PATENT DOCUMENTS

| | | |
|---|---|---|
| 6,849,527 B1 | 2/2005 | Xiang |
| 2006/0011984 A1 | 1/2006 | Currie |
| 2006/0014366 A1 | 1/2006 | Currie |
| 2006/0121736 A1 | 6/2006 | Yamazaki |
| 2006/0131665 A1 | 6/2006 | Murphy et al. |
| 2006/0134872 A1 | 6/2006 | Hattendorf et al. |
| 2006/0148143 A1 | 7/2006 | Bedell et al. |

FOREIGN PATENT DOCUMENTS

WO       2006066194 A2       6/2006

OTHER PUBLICATIONS

A.R. Powell, K. Eberl, F.E. Legoues, B.A. Ek, and S.S. Iyer, "Stability of strained Si1-yCy random alloy layers," J. Vac. Sci. Technol. B 11(3), May/Jun. 1993, pp. 1064-1068.

Shuhei Yagi, Katsuya Abe, Akira Yamada, and Makoto Konagai, "C Stability in Si1-yCy Epitaxial Films Grown by Low-Temperature Chemical Vapor Deposition," Jpn. J. Appl. Phys. vol. 42 (2003) pp. 1499-1502.

H.J. Osten, D. Endisch, E. Bugiel, B. Dietrich, G.G. Fischer, Myeongcheol Kim, D. Kruger, and P. Zaumseil, "Strain relaxation in tensile-strained Si1-yCy layers on Si(001)," Semicond. Sci. Technol. 11 (1996) pp. 1678-1687.

(Continued)

*Primary Examiner*—Felisa C Hiteshew
(74) *Attorney, Agent, or Firm*—David G. Dolezal; Robert L. King

(57) ABSTRACT

An anneal of an epitaxially grown crystalline semiconductor layer comprising a combination of group-IV elements. The layer contains at least one of the group of carbon and tin. The layer of epitaxially grown material is annealed at a temperature substantially in a range of 1,000 to 1,400 degrees Celsius for a period not to exceed 100 milliseconds within 10% of the peak temperature. The anneal is performed for example with a laser anneal or a flash lamp anneal. The limited-time anneal may improve carrier mobility of a transistor.

26 Claims, 4 Drawing Sheets

OTHER PUBLICATIONS

Yong Jeong Kim, Tae-Joon Kim, Tae-Kyung Kim, Byungwoo Park, and Jong Han Song, "The Loss Kinetics of Substitutional Carbon in Si1-xCx Regrown by Solid Phase Epitaxy," Jpn. J. Appl. Phys. vol. 40 (2001) pp. 773-776.

L.V. Kulik, D.A. Hits, M.W. Dashiell, and J. Kolodzey, "The effect of composition on the thermal stability of Si1-x-yGexCy/Si heterostructures," Applied Physics Letters, vol. 72, No. 16, Apr. 20, 1998, pp. 1972-1974.

J.W. Strane, H.J. Stein, S.R. Lee, S.T. Picraux, J.K. Watanabe, and J.W. Mayer, "Precipitation and relaxation in strained Si1-yCy/Si heterostructures," J. Appl. Phys., vol. 76, No. 6, Sep. 15, 1994, pp. 3656-3668.

J. Gluck, U. Konig, W. Winter, K. Brunner, K. Eberl, "Modulation-doped Si1-x-yGexCy p-type Hetero-FETs," Elsevier Science B.V., Physica E 2—1998, pp. 768-771.

Shuhei Yagi, Katsuya Abe, Akira Yamada, and Makoto Konagai, "Substitutional C. Incorporation into Si1-yCy Alloys Using Novel Carbon Source, 1,3-Disilabutane," Jpn. J. Appl. Phys. vol. 43, No. 7A, (2004) pp. 4153-4154.

O.G. Schmidt,—Chapter 13 "Photoluminescense and Transport" Silicon-Germanium Carbon Alloys: Growth, Properties, and Applications, edited by Sokrates T. Pantelides and Stefan Zollner, Taylor and Francis, New York, 2002, pp. 445 to 480.

O.G. Schmidt, Chapter 3, "Carbon Incorporation and Electronic Characterization" edited by Sokrates T. Pantelides and Stefan Zollner, Taylor and Francis, New York, 2002, pp. 59-89.

ANNEAL OF EPITAXIAL LAYER IN A SEMICONDUCTOR DEVICE

BACKGROUND OF THE INVENTION

1. Field of the Invention

This invention relates in general to semiconductor devices and more specifically to annealing an epitaxial layer in a semiconductor device.

2. Description of the Related Art

Semiconductor devices utilize epitaxially grown material that includes carbon or tin. Examples of such materials include alloys containing two or more of silicon, germanium, carbon, and tin. The addition of tin or carbon to a silicon or germanium layer may present difficulties due to relatively large lattice mismatches and phase diagram differences. For example, a silicon lattice has a spacing of 5.43 Angstroms and a germanium lattice has a spacing of 5.65 Angstroms. Tin has a lattice spacing of 6.49 Angstroms and diamond carbon has a lattice spacing of 3.57 Angstroms.

The lattice constant of relaxed carbon-doped silicon is smaller than that of silicon. Accordingly, a carbon-doped silicon layer epitaxially grown on a silicon layer may be under stress due to lattice constant mismatch. Such a strained layer may be used in semiconductor devices for enhanced performance.

One problem with epitaxial silicon carbon (or other layers having carbon) is that the material is thermally unstable. Thermal annealing at temperatures greater than 900 C may cause the conversion of carbon from substitutional to interstitial lattice sites, thereby increasing the lattice constant. Accordingly, by annealing the layer at a high temperature, the strain of an epitaxially grown silicon carbon alloy layer may undesirably decrease.

What is needed is an improved technique for annealing a carbon or tin alloy material.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
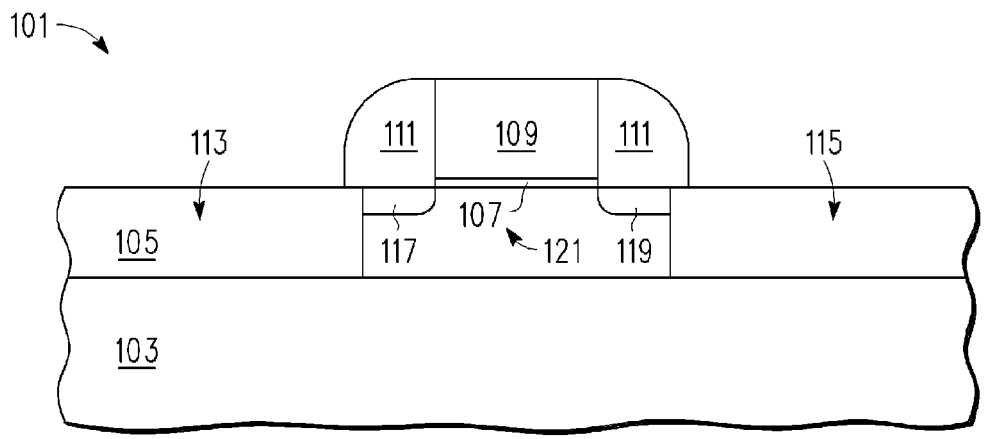
FIGS. 1-5 are cut away side views of a wafer during various stages in its manufacture according to one embodiment of the present invention.

FIG. 1 is a cutaway side view of one embodiment of a semiconductor device at one stage of its manufacture according to one embodiment of the present invention. Wafer 101 has a semiconductor on insulator (SOI) configuration that includes a semiconductor layer 105 (e.g. silicon) located on insulator layer 103. In one embodiment, layer 103 would be located on a bulk silicon substrate layer (not shown). Layer 105 has been implanted with dopants to form channel region 121 and lightly doped source/drain implant regions 117 and 119 and heavily doped source/drain implant regions 113 and 115. A gate 109 (e.g. polysilicon, metal) is formed over a gate dielectric 107 (e.g. $SiO_2$ or metal oxides such as hafnium or zirconium based). A dielectric gate spacer 111 is formed adjacent to gate 109. In other embodiments, wafer 101 may have other configurations (e.g. a bulk semiconductor configuration).

Figure 2:
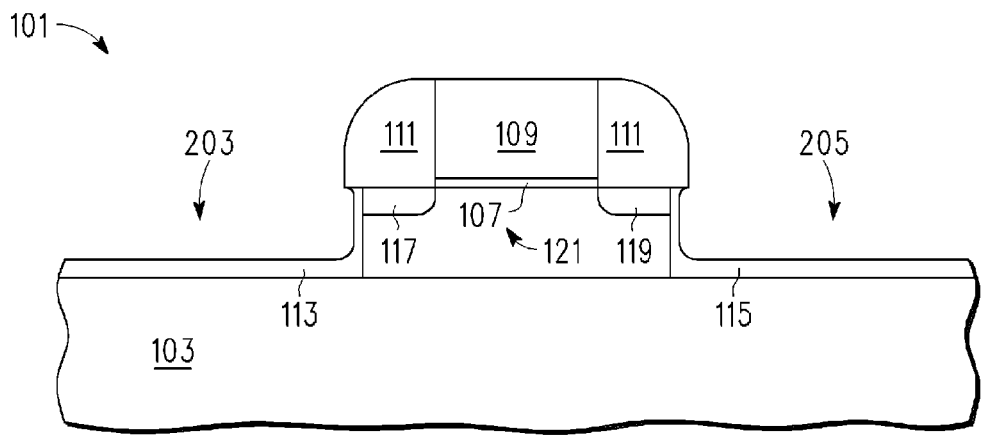

FIG. 2 shows a cutaway side view of wafer 101 after source/drain recesses 203 and 205 have been formed in layer 105. Not shown in FIG. 2 is a protective dielectric layer over gate 109. Recesses 203 and 205 are formed by etching regions 113 and 115 in FIG. 1 (e.g. with a wet etch or dry etch) with an etchant that is selective to the material of spacer 111, and the protective dielectric layer (not shown) over gate 109. In one embodiment, the etchant is a fluorine based plasma etchant, but other etch chemistries may be used in other embodiments. As shown in FIG. 2, the resulting etch leaves a portion of layer 105 over layer 103 in the source/drain areas.

Figure 3:
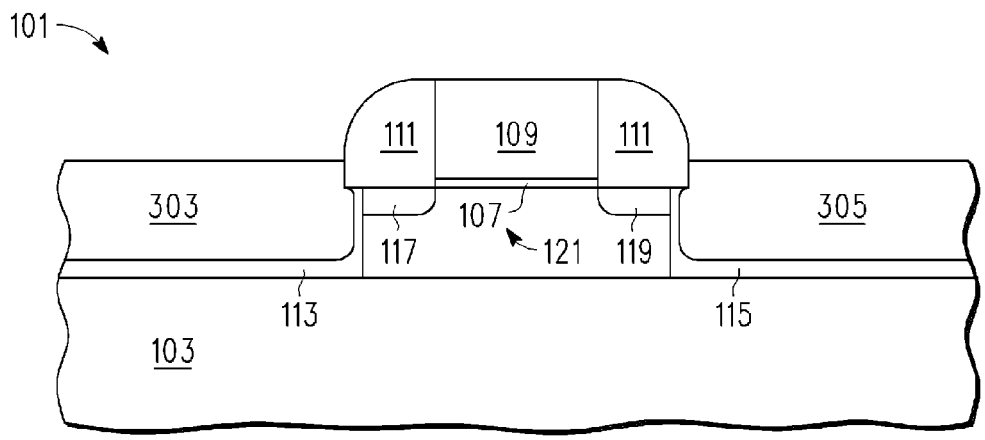

FIG. 3 shows a cutaway side view of wafer 101 after carbon containing layers 303 and 305 are epitaxially grown selectively on portions of wafer 101 including over the exposed portions of regions 113 and 115. In one embodiment, layers 303 and 305 are silicon carbon alloy layers formed in a chemical vapor deposition process by flowing a silicon precursor (Silane, dichlorosilane, purified trisilane, or other Si precursor) and a carbon precursor (e.g. Monomethyl silane diluted with hydrogen) at an elevated temperature (e.g. 400-700 C) at 20 Torr to atmospheric pressure. In one embodiment, layers 303 and 305 may be in situ doped with an impurity (e.g. N-type dopants phosphorus, arsenic, or antimony or P-type dopants boron, aluminum, gallium, or indium) by flowing a precursor (phosphine, arsine, diborane) with the silicon and carbon precursors. In one embodiment, prior to growing layers 303 and 305, wafer 101 is subjected to wet and thermal surface preparation processes to improve epitaxial growth.

In other embodiments, layers 303 and 305 may be formed by a non-selective growth process where the silicon carbon layer is also formed over other surfaces (e.g. over spacer 111 and the dielectric over gate 109). In these processes, the silicon carbon alloy layer over non silicon surfaces would be polycrystalline or amorphous. An etchant that selectively removes amorphous or polycrystalline material is used to remove the amorphous or poly silicon carbon alloy. In one embodiment, gaseous hydrogen chloride maybe utilized as an etchant. In one embodiment, the deposition may be completed by alternating deposition and etch process steps.

Layers 303 and 305 have a crystalline structure that includes substitutional carbon and interstitial carbon in the silicon lattice. In one embodiment, the percentage of carbon ranges from 0.1 to 7 atomic percent. The majority of the lattice sites of layers 303 and 305 are occupied by silicon atoms. Other lattice sites in layers 303 and 305 may be occupied by other elements (e.g. phosphorus, arsenic, antimony, boron).

The remaining portions of regions 113 and 115 of layer 105 in recesses 203 and 205 are used as template layers for layers 303 and 305 respectively. Therefore, the crystal lattice of layers 303 and 305 will be strained (under tensile stress) because the lattice constant of a relaxed layer of silicon is greater than of the lattice constant of a layer of silicon carbon alloy.

Figure 4:
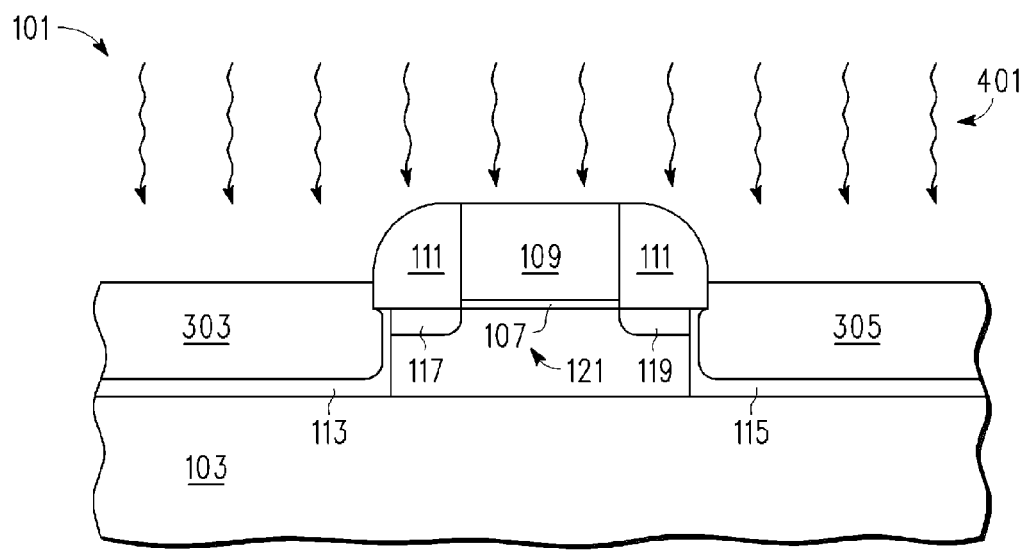

FIG. 4 is a cutaway side view of wafer 101 during a laser annealing process. In one embodiment, wafer 101 is subject to a laser annealing process wherein laser radiation 401 transfers energy to the wafer 101 to heat an upper portion of wafer 101 at an elevated temperature for a period of time. In one embodiment, laser radiation 401 heats the upper region (e.g. top 100 microns) of the wafer (relative to the view shown in FIG. 4) at a peak temperature in the range of 1000-1400 C for a period not to exceed 100 milliseconds within 10% of the peak temperature. In another embodiment, the laser radiation 401 heats the upper region for a period not to exceed 10 milliseconds within 10% of the peak temperature. In one embodiment, wafer 101 is subjected to the laser energy for 0.8 milliseconds. In one embodiment, the laser energy has a wavelength of 10.6 microns, but other wavelengths may be utilized in other embodiments. In one embodiment, the wafer is placed on a heated chuck (e.g. 375-450 C) during the laser annealing process. In other embodiments, the length of time that wafer 101 is irradiated may depend on laser power, laser beam width, and desired temperature. In one embodiment, laser energy may be generated by the ULTRATECH LSA-100 by ULTRATECH Inc.

In one embodiment, a radiation absorber layer (e.g. amorphous organic film or nitride dielectric) (not shown) may be formed on wafer 101 prior to the annealing and may be removed subsequent to the annealing. In one embodiment, the radiation absorber layer is 300 to 1000 Angstroms thick. The layer absorbs radiation for improved substrate heating during laser annealing.

In another embodiment, wafer 101 may be annealed by subjecting wafer 101 to a flash anneal lamp at a peak temperature in the range of 1000-1400 C for a period of time not to exceed 100 milliseconds within 10% of the peak temperature. In another embodiment, wafer 101 is subjected to a flash anneal lamp at such temperatures not to exceed 10 milliseconds within 10% of the peak temperature.

In one embodiment, the laser or flash annealing process serves as the primary activation for source/drain dopants including the extension dopants. However in other embodiments, wafer 101 may be subject to a dopant activation anneal prior to the laser or flash anneal, and before or after growing layers 303 and 305.

One advantage of performing the anneal step after the implantation of dopants in the source/drain regions (current terminal regions of a FET transistor) and the epitaxial growth is that it may reactivate dopants that were deactivated by the thermal cycle during the epitaxial growth.

The above anneal processes at the temperatures for the period of time given increases the horizontal strain of layers 303 and 305. Accordingly, these layers are under an increased tensile stress after the anneal process.

It is believed that this increased stress of layers 303 and 305 induced by the anneal process may be due to the repair of microscopic defects in the crystalline structure of those layers. These repairs may include the conversion of interstitial carbon to substitutional carbon and the removal of hydrogen or other precursor components from the silicon-silicon or silicon-carbon bond centers. These repairs may also make interstitial dopants (e.g. phosphorus, arsenic) substitutional. In one embodiment, the substitutional carbon after annealing is greater than 2 atomic percent.

With conventional anneal processes, the long anneal times (e.g. 1 second) at elevated temperatures (e.g. 900 C and above) would result in the conversion of substitutional carbon to interstitial carbon, thereby reducing the planar stress on layers 303 and 305 due to the increase of the lattice constant of the silicon carbon alloy layer or the formation of silicon carbide nanocrystals.

It is believed that the reduction in the anneal time of laser or flash anneal on epitaxial silicon carbon alloy layers 303 and 305 inhibits the conversion of substitutional carbon to interstitial carbon while allowing for the repair of crystalline defects. Accordingly, where the longer anneal times in conventional anneals would act to undesirably reduce stress, the laser or flash anneal for a reduced period of time actually increases the stress.

In one example, an epitaxial silicon carbon alloy layer of 600 Angstroms thickness was subject to a laser anneal process with a laser energy at a wavelength of 10.6 microns for 0.8 milliseconds. Prior to the laser annealing process, the separation between x-ray diffraction peaks from the silicon substrate and the silicon carbon alloy layer was 2500 seconds of arc. After the laser anneal process, this separation increased to 3000 seconds of arc. This increase in separation of arc is consistent with an increase of the substitutional carbon content of the silicon carbon alloy from 2.2 to 2.6 atomic percent carbon or a decrease in the amount of hydrogen contained in the epitaxial silicon carbon alloy.

This reduction in the separation of arc corresponds directly to a decrease in the vertical lattice constant of the layer from approximately 5.38 Angstroms to 5.36 Angstroms. This decrease in the vertical lattice constant is indicative in an increase of planar tensile stress from 1.8 Gigapascal to 2.1 Gigapascal.

Accordingly, based on these results, the use of an anneal process at a relatively high temperature for a relatively short duration on an epitaxial silicon carbon alloy acts to increases the tensile stress on the epitaxial source/drain layers 303 and 305.

Figure 5:
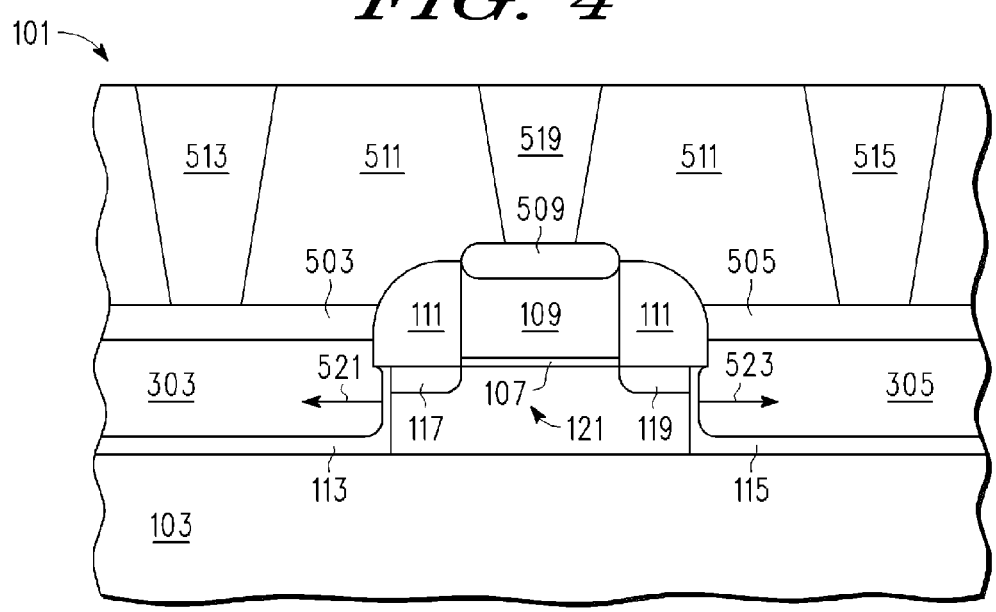

FIG. 5 is a cutaway side of wafer 101 after subsequent processes have been performed on wafer 101. Wafer 101 includes silicide structures 503, 505, and 509 formed on source/drain layers 303 and 305 and gate 109 respectively by conventional silicidation processes. A dielectric layer 511 is formed over wafer 101 and then contacts 513, 519, and 515 (e.g. tungsten) are formed to electrically contact the silicide structures 503, 509, and 505 respectively. The dielectric layer 511 may consist of one or more layers of different dielectric materials (e.g., silicon dioxide, silicon nitride, or silicon oxynitride).

As shown in FIG. 5, the increase in the planar tensile stress of layers 303 and 305 imparts a planar tensile stress (as shown by arrows 521 and 523) on channel region 121. For N-channel transistors (NMOS transistors), the increase in planar tensile stress in the channel region acts to increase carrier mobility, thereby improving its performance. In one example, an increase in the planar tensile stress of layers 303 and 305 by 1.5 Gigapascal correspond to a drive current increase of approximately ten percent.

Wafer 101 may be subjected to subsequent processes to form other structures. For example, interconnects and interlayer dielectrics may be subsequently formed on wafer 101. Afterwards, external conductors (e.g. bond pads) and passivation layers maybe formed on wafer 101. Subsequently, wafer 101 may be diced into separate integrated circuits.

In one embodiment, wafer 101 includes other N-channel devices and P-channel devices (not shown). In some embodiments where the device in FIG. 5 is an N-channel device, recesses (e.g. 203 and 205) are not formed adjacent to the gate spacers of the P-channel transistors by selectively masking these areas. In other embodiments, such recesses are formed adjacent to the gate spacers of P-channel devices wherein other materials (e.g. a silicon germanium alloy) may be grown in the recesses.

In other embodiments, the anneal processes described herein maybe performed on wafers with other types of materials or other combinations of materials. For example, layer 105 may include other Group IV elements such as carbon, silicon, germanium, or tin. For example, layers 303 and 305 may be made of a silicon germanium carbon alloy, a germanium tin alloy, and a silicon tin alloy, or a silicon germanium tin alloy.

FIGS. 6-10 show various stages of a wafer during manufacture of another embodiment of the present invention. In the embodiments of FIGS. 6-10, a layer of the channel region including carbon or tin is annealed to improve transistor performance.

Figure 6:
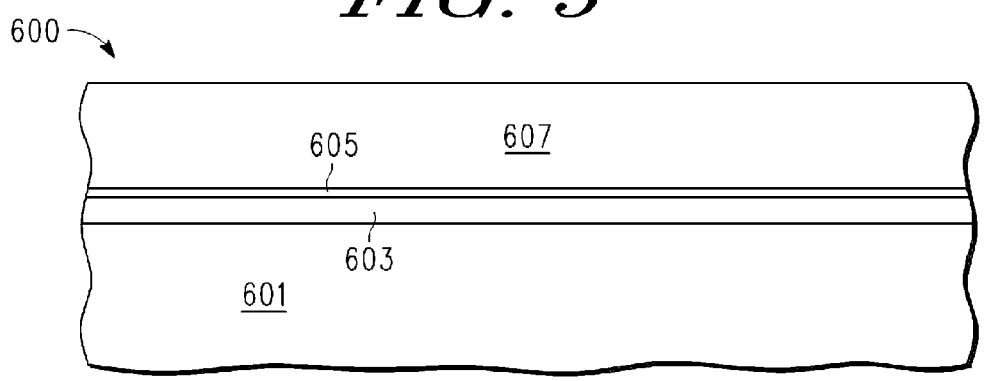
FIGS. 6-10 are cut away side views of a wafer during various stages in its manufacture according to another embodiment of the present invention.

In FIG. 6, wafer 600 includes a bulk semiconductor substrate layer 601 (e.g. silicon). An epitaxial layer 603 of a silicon carbon alloy is formed over substrate layer 601. In one embodiment, layer 603 has a thickness in the range of 100 Angstroms or less but may have other thicknesses in other embodiments. Layer 603 is epitaxially grown on layer 601 e.g. by a CVD process using layer 601 as a template layer such that the lattice constant of layer 603 matches the lattice constant of layer 601. In one embodiment, layer 603 may be grown by other epitaxial processes. Accordingly, where layer 601 is silicon and layer 603 is a silicon carbon alloy, layer 603 is under a planar tensile stress.

A gate dielectric layer 605 is formed on layer 603. A layer 607 of gate material (e.g. polysilicon or metal) is formed on dielectric 605. In other embodiments, wafer 600 may have other configurations (e.g. an SOI configuration).

Figure 7:
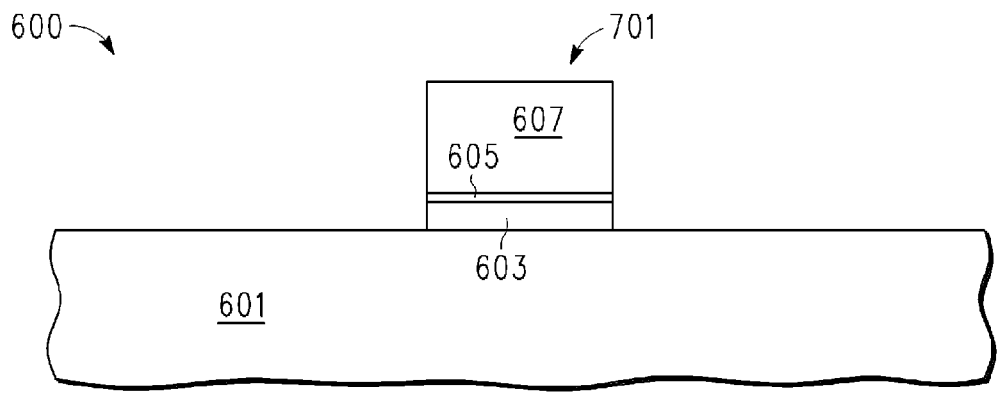

In FIG. 7, a gate 701 is formed by patterning layer 607. Layers 605 and 603 are subsequently patterned according to the same pattern. In one embodiment, layer 603 is etched with an etch process that is selective to the material of substrate layer 601. In one embodiment, layer 603 would be etched by a non-selective timed etch. In another embodiment, layer 603 would not be etched.

Figure 8:
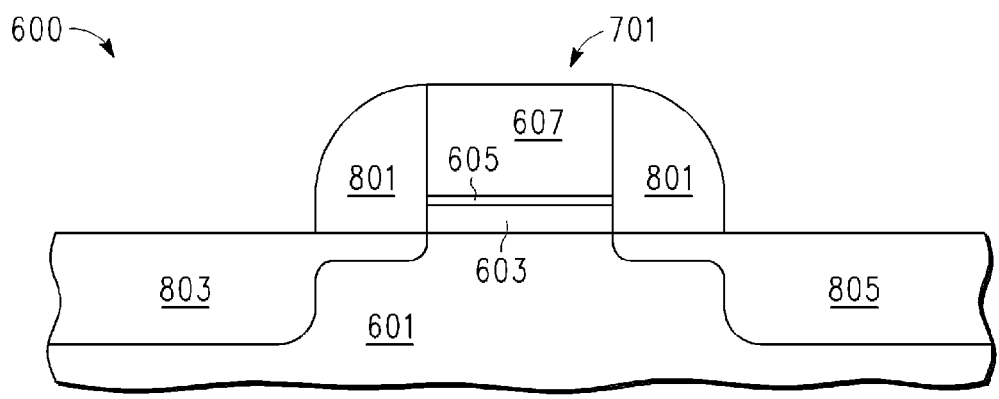

FIG. 8 shows wafer 600 after the formation of a gate spacer 801 and source/drain regions 803 and 805. The source/drain regions are formed by implanting dopants (e.g. arsenic, boron, phosphorus). In the embodiment shown, source/drain regions 803 and 805 include lightly-doped extensions which are implanted prior to forming spacer 801.

Figure 9:
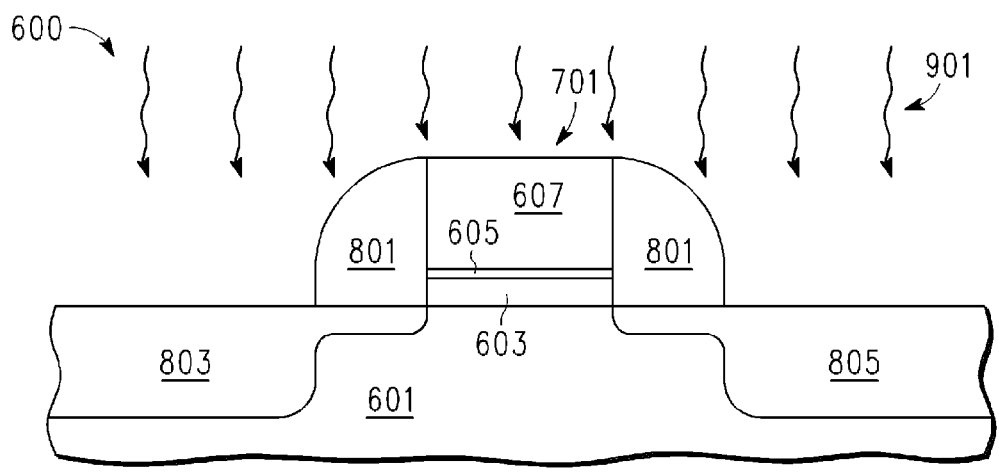

FIG. 9 shows wafer 600 during a laser anneal process wherein laser radiation 901 transfers energy to wafer 600 to heat an upper portion of wafer 600 at an elevated temperature for a period of time. In one embodiment, the laser annealing process is similar to the laser anneal process described in the text above regarding FIG. 4. In one embodiment, laser radiation 901 heats the upper region (e.g. top 100 microns) of the wafer (relative to the view shown in FIG. 9) at a peak temperature in the range of 1000-1400 C for a period not to exceed 100 milliseconds within 10% of the peak temperature. In one embodiment, wafer is heated at such temperatures for a period not to exceed 10 milliseconds within 10% of the peak temperature.

In another embodiment, wafer 600 may be annealed by subjecting wafer 600 to a flash anneal lamp at a peak temperature in the range of 1000-1400 C for a period of time not to exceed 100 milliseconds within 10% of the peak temperature. In one embodiment, wafer is heated at such temperatures for a period not to exceed 10 milliseconds within 10% of the peak temperature.

In embodiments where layer 603 includes a silicon carbon alloy and layer 601 includes silicon, annealing wafer 600 increases the tensile planar stress in layer 603. See the above discussion with respect to the annealing of layers 303 and 305.

Figure 10:
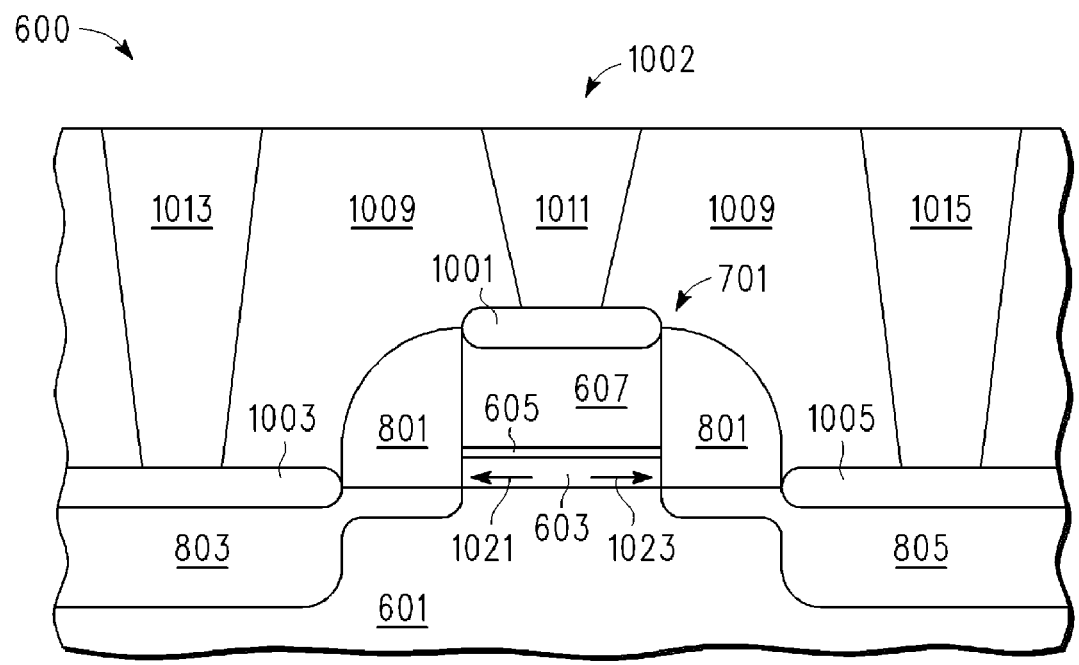

FIG. 10 shows wafer 600 after the formation of silicide structures 1003, 1005, and 1001, the formation of contacts 1013, 1011, and 1015, and dielectric layer 1009.

The annealing of layer 603 as described in the text associated with FIG. 9, increases the planar tensile stress of layer 603 (see arrows 1021 and 1023). In some embodiments, this increase in planar tensile stress in layer 603 acts to increase carrier mobility, thereby improving the performance in N-channel transistors.

In some embodiments, recesses (similar to recesses 203 and 205) may be formed in areas adjacent to gate spacer 801 wherein epitaxial material is grown in the recesses (similar to layers 303 and 305 for the embodiment of FIG. 5). These epitaxial layers in the source/drain regions would be annealed by laser radiation 901 (or by flash anneal) to increase the planar tensile stress in the channel region (similar to that described for layers 305 and 307).

Wafer 600 includes other transistors. In one embodiment, the n-channel transistors would include layer 603 and the p-channel transistors would not include such a layer. In some embodiments, the areas where the p-channel transistors would be formed would be masked during the formation of layer 603.

Figure 11:
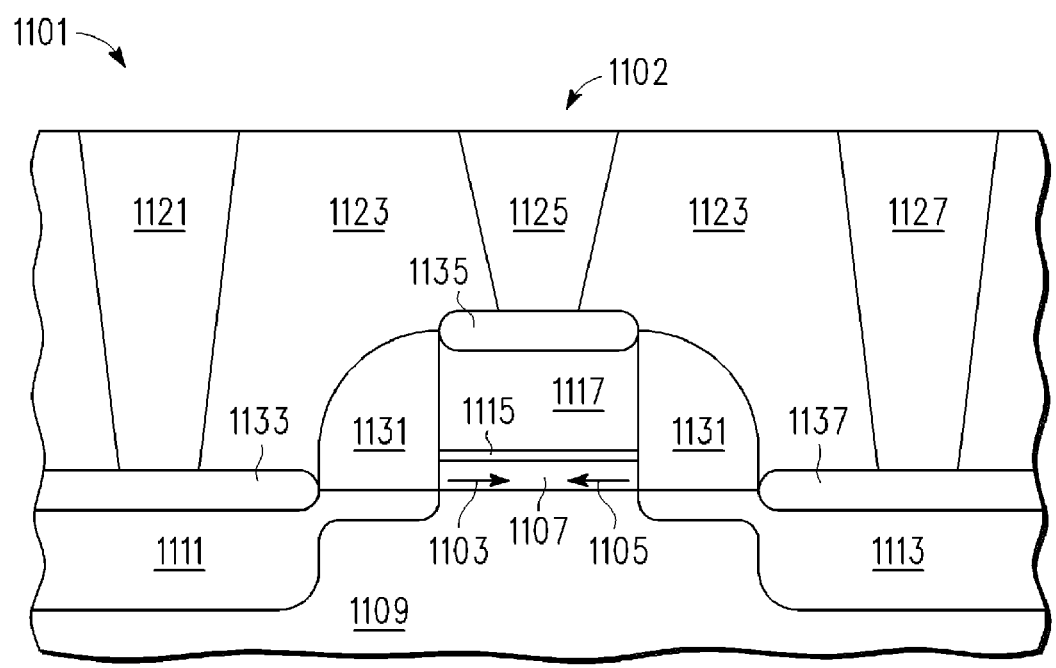
FIG. 11 is a cut away side view of a wafer during a stage in its manufacture according to another embodiment of the present invention.

FIG. 11 is a side view of another embodiment of a wafer. Wafer 1101 includes a transistor 1102 with a gate 1117, gate dielectric 1115, gate spacer 1131, silicide structures 1133, 1135, 1137, contacts 1121, 1125, and 1127, dielectric 1123, and source/drain regions 1111 and 1113 located in substrate layer 1109.

Wafer 1101 includes a channel layer 1107 of epitaxially grown material where the lattice constant of the material of layer 1107 when in a relaxed state is greater than the lattice constant of the material of substrate layer 1109. Accordingly, because layer 1107 is grown using layer 1109 as a template layer, layer 1107 is under a compressive planar stress. Because channel layer 1107 is under a compressive planar stress, layer 1107 (where transistor 1102 is a P-channel transistor) provides for an increased carrier mobility during operation as opposed to a transistor that does not have a strained channel layer 1107.

In one embodiment, layer 1107 may be one of silicon germanium carbon, germanium carbon, germanium tin, silicon germanium tin, or silicon germanium carbon tin.

Wafer 1101 was subjected to a laser anneal or flash anneal at a peak temperature in the range of 1000-1400 C for a period not to exceed 100 milliseconds within 10% of the peak temperature. Such an anneal may repair defects produced during the epitaxial growth process or during subsequent processes on wafer 1101. Repairing defects in the epitaxial layer 1107 may increase the mobility of the channel region thereby improving the performance of the transistor. Furthermore, the relatively short annealing time inhibits the thermal degradation of that layer. In other embodiments, wafer 1101 was subjected to a laser anneal or flash anneal at a peak temperature in the range of 1000-1400 C for a period not to exceed 10 milliseconds within 10% of the peak temperature.

In some embodiments, a wafer may include both p-channel and n-channel transistors where the p-channel transistors include an epitaxial layer in the channel region similar to layer 1107 and the n-channel transistors include an epitaxial layer in the channel region similar to layer 603. Also, in other embodiments, the n-channel transistors may include source/drain regions similar to layers 303 and 305 to increase the planar tensile stress in the channel regions.

In other embodiments, the anneal step may be performed at other times after the formation of the epitaxial layer. For example, the anneal step may be performed before implanting dopants for forming the source/drain regions and extensions of those regions.

In one embodiment, a method includes providing a semiconductor layer and forming a layer of epitaxially grown crystalline material on the semiconductor layer using the semiconductor layer as a template layer. The layer of epitaxially grown crystalline material includes a combination of group IV elements including at least one of a group of carbon and tin. The method also includes annealing the layer of epitaxially grown crystalline material at a peak temperature substantially in a range of 1,000 to 1,400 degrees Celsius for a period not to exceed 100 milliseconds within 10% of the peak temperature.

In another embodiment, the method includes forming a transistor, the transistor having a current terminal region including at least a portion formed from a layer of epitaxially grown crystalline material, the layer of epitaxially grown crystalline material including silicon and carbon. The method also includes annealing the layer of epitaxially grown crystalline material at a peak temperature substantially in a range of 1,000 to 1,400 degrees Celsius for a period not to exceed 100 milliseconds within 10% of the peak temperature.

In another embodiment, the method includes forming a P-channel transistor. The transistor has a channel region including at least a portion formed from a layer of epitaxially grown material comprising at least one of a group of silicon and germanium and further comprising at least one of a group of tin and carbon. The method also includes annealing the layer of epitaxially grown material at a peak temperature substantially in a range of 1,000 to 1,400 degrees Celsius for a period not to exceed 100 milliseconds within 10% of the peak temperature.

In another embodiment, the method includes forming an N-channel transistor. The transistor has a channel region. At least a portion of the channel region is formed from a layer of epitaxially grown material comprising silicon and carbon. The method further includes annealing the layer of epitaxially grown material at a peak temperature substantially in a range of 1,000 to 1,400 degrees Celsius for a period not to exceed 100 milliseconds within 10% of the peak temperature.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method comprising:
    providing a semiconductor layer;
    forming a layer of epitaxially grown crystalline material on the semiconductor layer using the semiconductor layer as a template layer, the layer of epitaxially grown crystalline material comprising a combination of group IV elements including at least one of a group of carbon and tin; and
    annealing the layer of epitaxially grown crystalline material at a peak temperature in a range of approximately 1,000 to 1,400 degrees Celsius for a period not to exceed 100 milliseconds within 10% of the peak temperature.

2. The method of claim 1 wherein the annealing includes performing laser annealing.

3. The method of claim 1 wherein the annealing includes performing a flash lamp anneal.

4. The method of claim 1 wherein the layer of epitaxially grown crystalline material comprises carbon which has a first portion in interstitial form and a second portion in substitutional form, wherein the annealing converts interstitial form carbon to substitutional form to modify the layer of epitaxially grown crystalline material to have a substitutional carbon content of greater than two atomic percent.

5. The method of claim 1 further comprising:
    in situ doping the layer of epitaxially grown crystalline material with an N-type dopant of at least one of a group of arsenic, phosphorous, nitrogen, and antimony.

6. The method of claim 1 further comprising:
    in situ doping the layer of epitaxially grown crystalline material with a P-type dopant of at least one of a group of boron, aluminum, gallium, and indium.

7. The method of claim 1 wherein the combination of group IV elements includes one or more of a group consisting of silicon and geranium.

8. The method of claim 1 further comprising:
    wherein the layer of epitaxially grown crystalline material includes at least a portion of a current terminal region of a transistor.

9. The method of claim 1 further comprising:
    wherein the layer of epitaxially grown crystalline material includes at least a portion of a channel region of a transistor.

10. The method of claim 1 wherein the combination includes no more than twenty five atomic percent of a group consisting of carbon and tin.

11. The method of claim 1 wherein the annealing further includes annealing the layer of epitaxially grown crystalline material at a peak temperature in a range of approximately 1,000 to 1,400 degrees Celsius for a period not to exceed 10 milliseconds within 10% of the peak temperature.

12. A method comprising:
    forming a transistor, the transistor having a current terminal region including at least a portion formed from a layer of epitaxially grown crystalline material, the layer of epitaxially grown crystalline material comprising silicon and carbon; and
    annealing the layer of epitaxially grown crystalline material at a peak temperature in a range of approximately 1,000 to 1,400 degrees Celsius for a period not to exceed 100 milliseconds within 10% of the peak temperature.

13. The method of claim 12 further comprising:
    in situ doping the layer of epitaxially grown crystalline material with an N-type dopant of at least one of a group of nitrogen, phosphorus, arsenic, or antimony.

14. The method of claim 12 wherein the annealing functions as a primary activation method to activate dopants into the current terminal region of the transistor.

15. The method of claim 12 wherein the layer of epitaxially grown crystalline material is formed over a semiconductor layer, the method further comprising:
    etching a region of the semiconductor layer to remove some but not all of a semiconductor material in the region;
    forming the epitaxially grown crystalline material in the region where some of the semiconductor material was removed.

16. The method of claim 12 wherein the annealing the layer of epitaxially grown crystalline material includes performing laser annealing.

17. The method of claim 12 wherein the annealing includes performing a flash lamp anneal.

18. The method of claim 12 wherein a first portion of the carbon in the layer of epitaxially grown crystalline material is in interstitial form and a second portion of the carbon in the layer of epitaxially grown crystalline material is in substitutional form, wherein the annealing converts interstitial form of carbon to substitutional form to modify the layer of epitaxially grown crystalline material to have a substitutional carbon content of greater than two atomic percent.

19. The method of claim 12 wherein the annealing further includes annealing the layer of epitaxially grown crystalline material at a peak temperature in a range of approximately 1,000 to 1,400 degrees Celsius for a period not to exceed 10 milliseconds within 10% of the peak temperature.

20. The method of claim 12 wherein a at least a portion of a channel region of the transistor is located in the layer of epitaxially grown crystalline material.

21. A method comprising:
forming a P-channel transistor, the transistor having a channel region including at least a portion formed from a layer of epitaxially grown material comprising at least one of a group of silicon and germanium and further comprising at least one of a group of tin and carbon; and
annealing the layer of epitaxially grown material at a peak temperature in a range of approximately 1,000 to 1,400 degrees Celsius for a period not to exceed 100 milliseconds within 10% of the peak temperature.

22. The method of claim 21 further comprising:
in situ doping the layer of epitaxially grown material with a P-type dopant of at least one of boron, indium, aluminum and gallium.

23. The method of claim 21 wherein the annealing the layer of epitaxially grown material includes laser annealing.

24. The method of claim 21 further comprising:
the annealing the layer of epitaxially grown material includes flash lamp annealing.

25. The method of claim 21 wherein the annealing includes annealing the layer of epitaxially grown material at a peak temperature in a range of approximately 1,000 to 1,400 degrees Celsius for a period not to exceed 10 milliseconds within 10% of the peak temperature.

26. A method comprising:
forming an N-channel transistor, the transistor having a channel region, wherein at least a portion of the channel region is formed from a layer of epitaxially grown material comprising silicon and carbon; and
annealing the layer of epitaxially grown material at a peak temperature in a range of approximately 1,000 to 1,400 degrees Celsius for a period not to exceed 100 milliseconds within 10% of the peak temperature.

* * * * *

UNITED STATES PATENT AND TRADEMARK OFFICE
CERTIFICATE OF CORRECTION

| | | |
|---|---|---|
| PATENT NO. | : 7,416,605 B2 | |
| APPLICATION NO. | : 11/620987 | |
| DATED | : August 26, 2008 | |
| INVENTOR(S) | : Zollner et al. | |

It is certified that error appears in the above-identified patent and that said Letters Patent is hereby corrected as shown below:

Column 8, line 20, in Claim 7, delete "geranium." and insert -- germanium. --.

Column 9, line 14, in Claim 20, delete "wherein a" and insert -- wherein --.

Signed and Sealed this
Twenty-third Day of August, 2011

David J. Kappos
*Director of the United States Patent and Trademark Office*